(12) United States Patent
Liu

(10) Patent No.: US 8,081,931 B2
(45) Date of Patent: Dec. 20, 2011

(54) TRANSCEIVER DEVICE AND IMPEDANCE MATCHING METHOD

(75) Inventor: Tsu-Chun Liu, Hsinchu (TW)

(73) Assignee: IC Plus Corp., Hsin-Chu (TW)

( * ) Notice: Subject to any disclaimer, the term of this patent is extended or adjusted under 35 U.S.C. 154(b) by 634 days.

(21) Appl. No.: 12/206,916

(22) Filed: Sep. 9, 2008

(65) Prior Publication Data

US 2010/0026410 A1 Feb. 4, 2010

(30) Foreign Application Priority Data

Jul. 30, 2008 (TW) .............................. 97128860 A

(51) Int. Cl.
*H04B 1/38* (2006.01)

(52) U.S. Cl. ......... 455/73; 455/80; 455/522; 455/550.1; 333/17.3; 333/32

(58) Field of Classification Search .................... 455/73, 455/80, 522, 550.1; 333/17.3, 32
See application file for complete search history.

(56) References Cited

U.S. PATENT DOCUMENTS 6,331,785 B1 * 12/2001 Swanson et al. ................ 326/30
2007/0222697 A1 * 9/2007 Caimi et al. .................. 343/861
* cited by examiner

*Primary Examiner* — Tuan H Nguyen
(74) *Attorney, Agent, or Firm* — J.C. Patents

(57) ABSTRACT

A transceiver device and an impedance matching method are provided. In the impedance matching method, a plurality of matching modes is set. Each matching mode includes a default impedance and a corresponding default power. In addition, one of the matching modes is selected for outputting a transmission signal to a load. Besides, a response signal derived from the transmission signal is received. Further, whether the default impedance is matched with an impedance of the load or not is determined according to a parameter of the response signal. Thereby, the echo signal can be restrained from being generated.

10 Claims, 4 Drawing Sheets

TRANSCEIVER DEVICE AND IMPEDANCE MATCHING METHOD

CROSS-REFERENCE TO RELATED APPLICATION

This application claims the priority benefit of Taiwan application serial no. 97128860, filed Jul. 30, 2008. The entirety of the above-mentioned patent application is hereby incorporated by reference herein and made a part of this specification.

BACKGROUND OF THE INVENTION

1. Field of the Invention

The present invention generally relates to a transceiver device, in particular, to an impedance matching technique of the transceiver device.

2. Description of Related Art

In a communication system, usually a transceiver is used to transmit signals. The transceiver is composed of a transmitter (TX) and a receiver (RX). FIG. 1 is a schematic view of a conventional full duplex transceiver. Referring to FIG. 1, a near-end transceiver 102 and a far-end transceiver 104 are full duplex transceivers, that is, the near-end transceiver 102 and the far-end transceiver 104 may perform a bidirectional data transmission through a transmission line 114 at the same time. The near-end transceiver 102 includes a TX 106, an RX 108, and a hybrid circuit 116, and the far-end transceiver 104 includes a TX 110, an RX 112, and a hybrid circuit 118.

From the perspective of the near-end transceiver 102, the TX 106 may transmit the signal to the RX 112 in the far-end transceiver 104 through the transmission line 114. However, when the TX 106 in the near-end transceiver 102 transmits the signal to the far-end transceiver 104, if the impedances of the transmission line 114 and the transceivers 102 and 104 are not matched with each other, an echo signal 120 may be generated. The echo signal 120 may be transmitted back to the RX 108 in the near-end transceiver 102, and the RX 108 may consider the echo signal 120 as an interference noise.

It should be noted that the larger impedance difference of the transmission line 114 and the transceivers 102 and 104 results in the larger magnitude of the echo signal 120.

SUMMARY OF THE INVENTION

Accordingly, the present invention is directed to a transceiver device, capable of restraining an echo signal from being generated.

The present invention is further directed to an impedance matching method, for cancelling the echo signal.

The present invention provides a transceiver device, which includes an adjustable impedance unit, an adjustable power unit, and a receiving module. The adjustable impedance unit selects a default impedance from a plurality of candidate impedances according to a matching mode signal. The adjustable power unit is coupled to the adjustable impedance unit, and selects a default power from a plurality of candidate powers according to the matching mode signal. The default power is corresponding to the default impedance. The adjustable power unit outputs a transmission signal to a load together with the adjustable impedance unit. The receiving module is coupled to the adjustable impedance unit, for receiving a response signal derived from the transmission signal, and determining whether the default impedance is matched with an impedance of the load or not according to a parameter of the response signal.

In an embodiment of the present invention, the receiving module includes a control unit. The control unit is coupled to the adjustable impedance unit and the adjustable power unit, for checking whether the parameter of the response signal falls within a default range or not. When the parameter falls within the default range, it represents that the default impedance is matched with the impedance of the load, and when the parameter does not fall within the default range, the control unit alters the matching mode signal correspondingly.

In an embodiment of the present invention, the receiving module further includes a current detection unit. The current detection unit is coupled to the adjustable impedance unit, the adjustable power unit, and the control unit, for detecting a current value outputted from the adjustable power unit. In another embodiment, the receiving module further includes an analog-to-digital converter (ADC), and the ADC is coupled between the adjustable impedance unit and the control unit, for converting the response signal. In still another embodiment, the transceiver device further includes a triggering device. The triggering device is coupled to the adjustable impedance unit and the adjustable power unit, and generates the matching mode signal according to a trigger event.

In an embodiment of the present invention, the adjustable power unit is an adjustable voltage unit. In another embodiment, the adjustable power unit is an adjustable current unit. In still another embodiment, the parameter of the response signal is a voltage or a current.

From another point of view, the present invention provides an impedance matching method, which includes setting a plurality of matching modes, in which each matching mode has a default impedance and a corresponding default power. In addition, one of the matching modes is selected, thereby outputting a transmission signal to a load. Besides, a response signal derived from the transmission signal is received. Further, whether the default impedance is matched with an impedance of the load or not is determined according to a parameter of the response signal.

In the transceiver device of the present invention, a plurality of matching modes is set. Each matching mode includes a default impedance and a corresponding default power. In addition, the impedance of the transceiver device is made to match with the impedance of the external load by altering the matching mode of the transceiver device. Thereby, the echo signal can be restrained from being generated.

In order to have a further understanding of features and efficacies of the present invention, a detailed description is given in the following with embodiments and the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
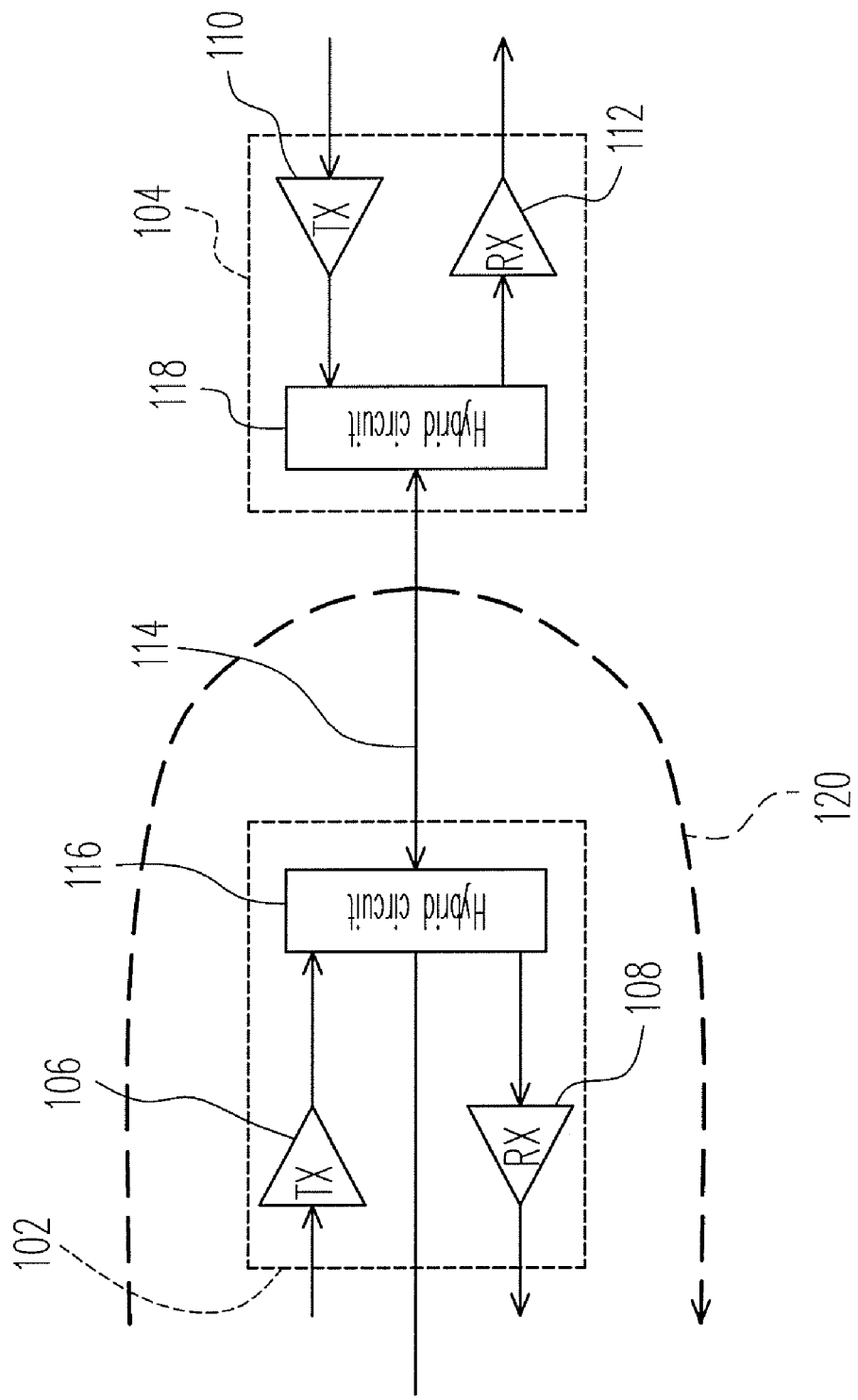
FIG. 1 is a schematic view of a conventional full duplex transceiver.

Reference will now be made in detail to the present embodiments of the invention, examples of which are illustrated in the accompanying drawings. Wherever possible, the same reference numbers are used in the drawings and the description to refer to the same or like parts.

In the prior art, usually the impedance of the near-end transceiver device may not be matched with the impedances of the transmission line and the far-end transceiver device, so as to generate the strong echo signal, thereby affecting a signal-to-noise Ratio (SNR) of the transceiver device.

Accordingly, in an embodiment of the present invention, an impedance matching technique of a transceiver device is provided. By using the technique, the transceiver device may automatically adjust the impedance, such that the impedance may be matched with the impedances of the transmission line and the far-end device, thereby restraining the echo signal from being generated. In addition, when the impedance of the transceiver device is adjusted, the transceiver device may adjust a power unit of a transmission module, thereby the output power of the adjustable power unit may be maintained within a fixed range. In this manner, after the load receives the signal output by the transceiver device, it is relatively easy to process the signal. A further description is given with the accompanying drawings.

First Embodiment

Figure 2:
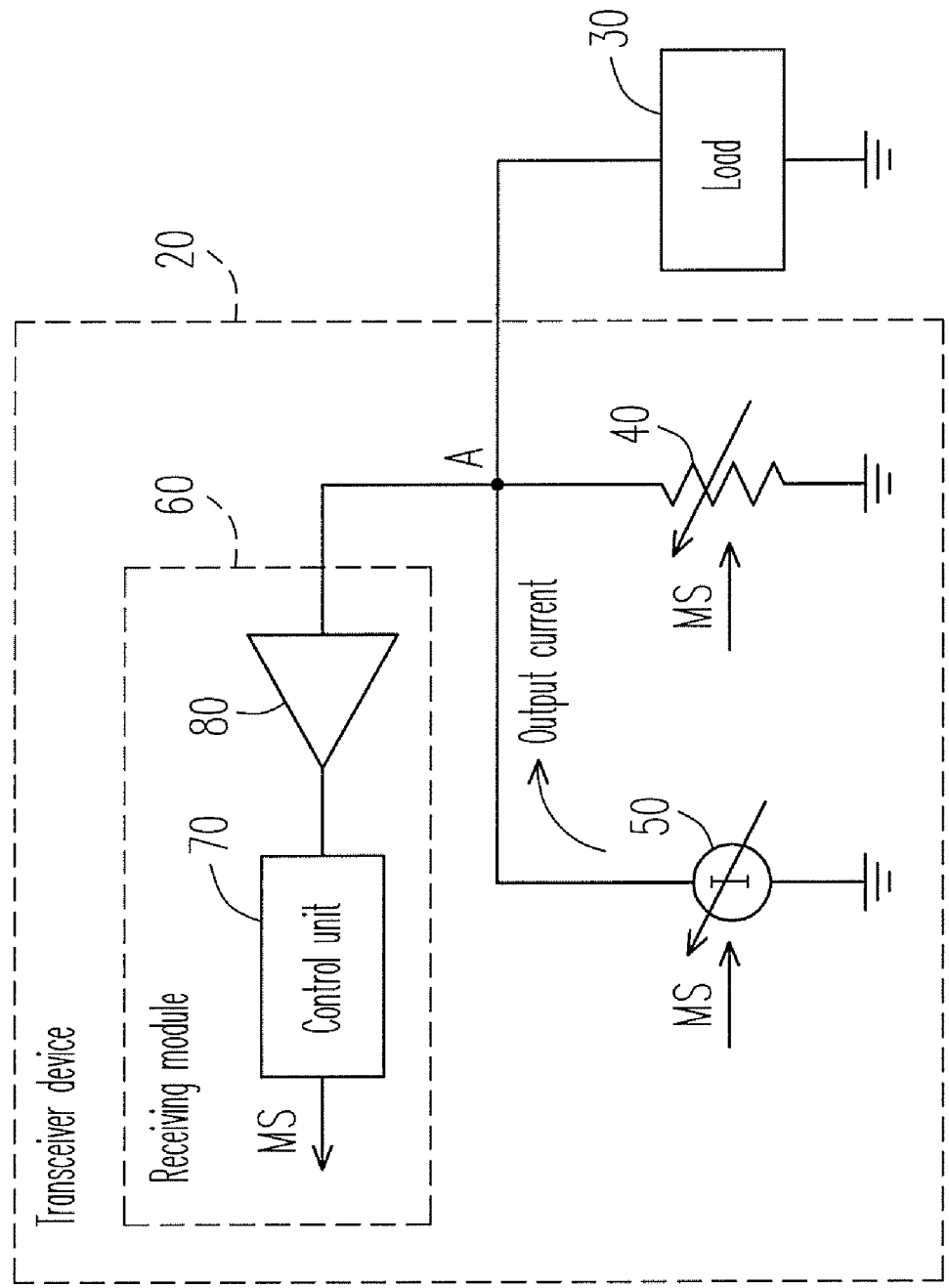
FIG. 2 is a schematic view of a transceiver device according to a first embodiment of the present invention.

FIG. 2 is a schematic view of a transceiver device according to a first embodiment of the present invention. Referring to FIG. 2, a transceiver device 20 may be coupled to a load 30. In this embodiment, the transceiver device 20 includes an adjustable impedance unit 40, an adjustable power unit 50, and a receiving module 60. The adjustable impedance unit 40 is coupled to the adjustable power unit 50, the receiving module 60, and the load 30. In this embodiment, the adjustable power unit 50 is, for example, an adjustable current unit. Besides, the receiving module 60 includes, for example, a control unit 70 and an analogy-to-digital converter (ADC) 80, in which the ADC 80 is coupled to the load 30 and the control unit 70. On the other hand, the load 30 is, for example, composed of the transmission line and the far-end transceiver device.

Figure 3:
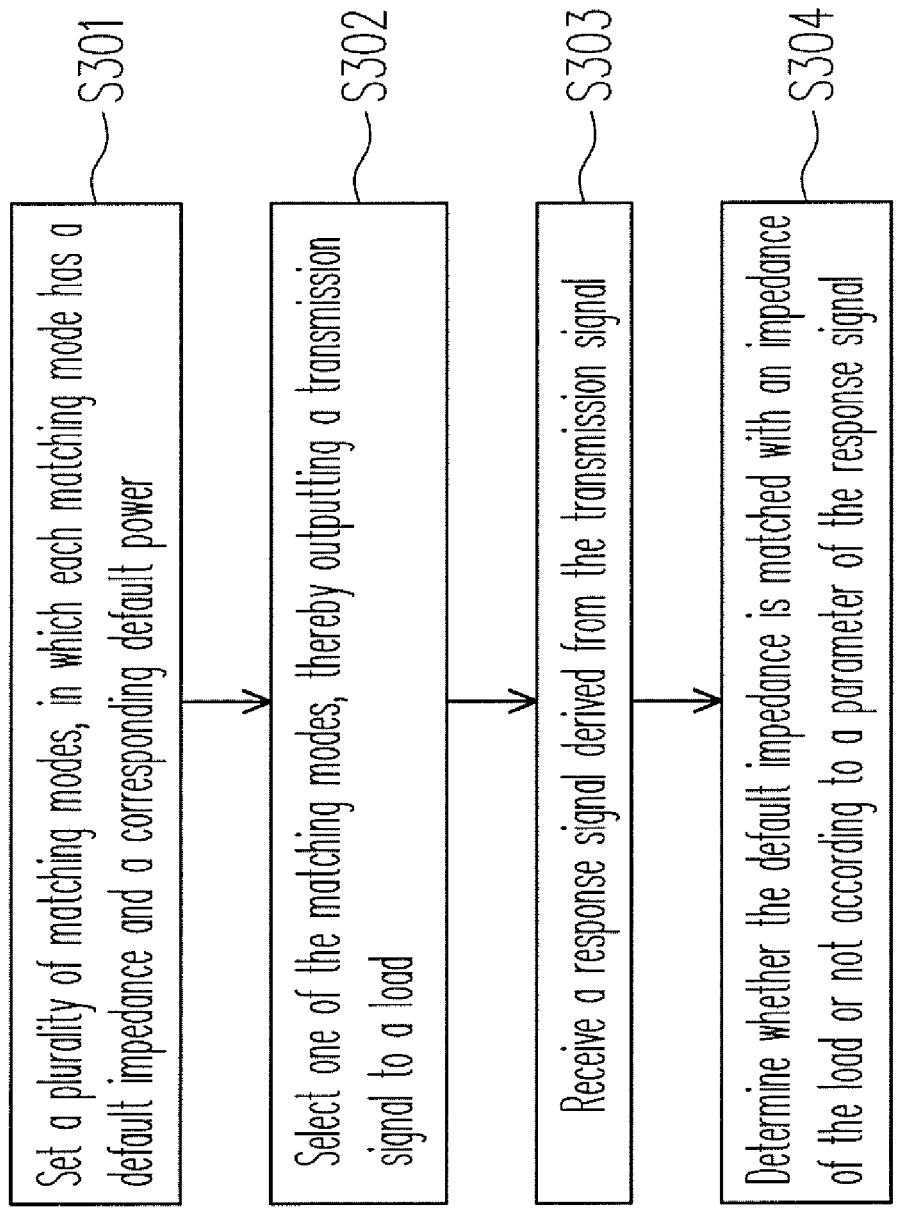
FIG. 3 is a flow chart of processes of an impedance matching method according to the first embodiment of the present invention.

FIG. 3 is a flow chart of an impedance matching method according to the first embodiment of the present invention. Referring to FIGS. 2 and 3, in Step S301, the transceiver device 20 firstly sets a plurality of matching modes. In this embodiment, the plurality of matching modes is, for example, five matching modes. The transceiver device 20 may select one of the matching modes according to a matching mode signal MS. Each matching mode has a default impedance and a corresponding default power. The plurality of matching modes, the plurality of candidate impedances, and the corresponding plurality of candidate powers of this embodiment are described with the Table 1 as an example.

TABLE 1

Corresponding table of the matching mode, the candidate impedance, and the candidate power of the first embodiment

| Matching Mode | Candidate Impedance (Ω) | Candidate Power (A) |
|---|---|---|
| First Mode | 80 Ω | 1/40 A |
| Second Mode | 90 Ω | 1/45 A |
| Third Mode | 100 Ω | 1/50 A |
| Fourth Mode | 110 Ω | 1/55 A |
| Fifth Mode | 120 Ω | 1/60 A |

It may be known from the Table 1 that the adjustable impedance unit 40 has the candidate impedances corresponding to the plurality of matching modes, and selects one of the candidate impedances as the default impedance according to the matching mode signal MS. Similarly, the adjustable power unit 50 also has a plurality of candidate powers corresponding to the candidate impedances. The adjustable power unit 50 may select one of the candidate powers as the default power according to the matching mode signal MS.

Next, in Step S302, the transceiver device 20 selects one of the matching modes, thereby outputting the transmission signal to the load 30. In this embodiment, it is assumed that an initial matching mode of the transceiver device 20 is the third mode. Therefore, under the third mode, an output current of the adjustable power unit 50 may be set to 1/50 A, and an impedance of the adjustable impedance unit 40 may be set to 100Ω. That is to say, the adjustable power unit 50 may output the current of 1/50 A as the transmission signal. Based on the Ohm's law, the output current of the adjustable power unit 50 and the impedance of the adjustable impedance unit 40 are known, and if a voltage of a node A is obtained, the impedance of the load 30 may be deduced, so as to determine whether the impedance of the adjustable impedance unit 40 is matched with the impedance of the load 30 or not.

Therefore, Step S303 may be performed, in which the receiving module 60 receives a response signal derived from the transmission signal. In this embodiment, the voltage signal of the node A may be used as the response signal derived from the transmission signal. In order to measure the voltage of the node A, in this embodiment, the voltage signal of the node A is converted to a digital signal by using the ADC 80, and is then output to the control unit 70.

Next, in Step S304, the control unit 70 may determine whether the impedance of the adjustable impedance unit 40 is matched with the impedance of the load 30 or not according to a parameter of the response signal. More particularly, under the third mode, the impedance of the adjustable impedance unit 40 is 100Ω, so according to the Ohm's slaw, when the impedance of the load 30 is 100Ω, the voltage of the node A is 1 V. In other words, the control unit 70 may determine the voltage of the node A by using the digital signal, so as to determine whether the impedance of the adjustable impedance unit 40 is matched with the impedance of the load 30 or not.

Table 2 is a contrast table of the voltage range of the node A according to each matching mode. In this embodiment, the control unit 70 may determine whether the impedance of the adjustable impedance unit 40 is matched with the impedance of the load 30 or not according to the Table 2. Under the third mode, when the voltage of the node A falls within 1 V±10%, the impedance of the adjustable impedance unit 40 is considered to be matched with the impedance of the load 30. On the contrary, when the voltage of the node A does not fall within 1 V±10%, it represents that the impedance of the adjustable impedance unit 40 is not matched with the impedance of the load 30, the control unit 70 may alter the matching mode signal MS correspondingly, thereby altering the matching mode of the transceiver device 20. More particularly, when the voltage of the node A is larger than 1 V±10%, switch to another matching mode such that the impedance of the adjustable impedance unit 40 is increased. On the contrary, when the voltage of the node A is smaller than 1 V−10%, switch to another matching mode, such that the impedance of the adjustable impedance unit 40 is reduced. Steps S302-304 are repeatedly performed, such that the impedance of the adjustable impedance unit 40 is matched with the impedance of the load 30, thereby restraining the echo signal from being generated.

TABLE 2

Contrast table of the voltage range of the node A
corresponding to each matching mode of the first embodiment

| Matching Mode | Voltage range of the node A, when the impedance of the adjustable impedance unit 40 is matched with the impedance of the load 30 |
|---|---|
| First Mode | 1 V ± 10% |
| Second Mode | 1 V ± 10% |
| Third Mode | 1 V ± 10% |
| Fourth Mode | 1 V ± 10% |
| Fifth Mode | 1 V ± 10% |

It should be noted that, as seen from Table 1, when the adjustable impedance unit 40 adjusts the impedance to be larger, the adjustable power unit 50 adjusts the current to be smaller, and when the adjustable impedance unit 40 adjusts the impedance to be smaller, the adjustable power unit 50 adjusts the current to be larger. Therefore, in this embodiment, the output voltage of the adjustable power unit 50 may be maintained within a fixed range. In this manner, after the load 30 receives the signal output by the transceiver device 20, it is relatively easy to process the signal.

Although a possible aspect of the transceiver device and the impedance matching method is described in the above embodiment, those of ordinary skill in the art should know that different manufacturers have different designs on the transceiver device and the impedance matching method, so the application of the present invention is not limited to the possible aspect. In other words, as long as the plurality of matching modes is set, each matching mode has the default impedance and the corresponding default power, and the impedance of the transceiver device is made to match with the impedance of the external load by altering the matching mode of the transceiver device, the spirit of the present invention is satisfied. In the following, several embodiments are given, such that those of ordinary skill in the art may further understand the spirit of the present invention and implement the present invention.

Referring to FIG. 2, in the above embodiment, although the matching mode signal MS may be adjusted by using the control unit 70, it is only an alternative embodiment, and the present invention is not limited thereto. In other embodiments, the matching mode signal may also be generated by other devices. For example, the matching mode signal MS may be generated by using a triggering device (not shown). The triggering device may be coupled to the adjustable impedance unit 40 and the adjustable power unit 50. The triggering device may be, for example, a button, a key, a toggle switch, or other man-machine interfaces. The triggering device may generate the matching mode signal MS to the adjustable impedance unit 40 and the adjustable power unit 50 according to a trigger event, in which the trigger event is, for example, pressing, touching, toggling performed by a user. In this manner, the user may adjust the matching mode of the transceiver device 20 as desired.

In the above embodiment, although the plurality of matching modes is, for example, the five matching modes of Table 1, the present invention is not limited thereto. In other embodiments, those of ordinary skill in the art may also set other numbers of matching modes. Besides, those skilled in the art may also alter the candidate impedances and the candidate powers in each matching mode according to the requirement.

Besides, in Table 2, when the impedance of the adjustable impedance unit 40 is matched with the impedance of the load 30, the voltage range of the node A is only one alternative embodiment, and the present invention is not limited thereto. In other embodiments, those skilled in the art may alter the voltage range of the node A as desired.

Further, in the first embodiment, although the adjustable impedance unit 40 of FIG. 2 is connected to the load 30 in parallel, in other embodiments, the adjustable impedance unit 40 may be connected to the load 30 in series.

In addition, in the first embodiment, although the load 30 of FIG. 2 is, for example, the combination of the transmission line and the far-end transceiver device, the present invention is not limited thereto. In other embodiments, the load 30 may also be the combination of components with other aspects. It should be further noted that those skilled in the art should know that different transmission lines may result different impedances, and definitely, the impedance of the load 30 is also affected. Each transmission line has the impedance with a certain characteristic, so under the situation that the impedance of the load 30 is known, the transceiver device 20 may directly select the matching mode corresponding to the impedance of the load 30. However, even when the impedance of the load 30 is not known, the technique of the above embodiment may still be implemented. In other words, the technique of the above embodiment may be applied to any types of transmission lines.

Referring to FIG. 2, in the first embodiment, although the adjustable power unit 50 is, for example, the adjustable current unit, in another embodiment, the adjustable power unit 50 may also be an adjustable voltage unit. In the following, another embodiment is given for the reference of those skilled in the art.

Second Embodiment

Figure 4:
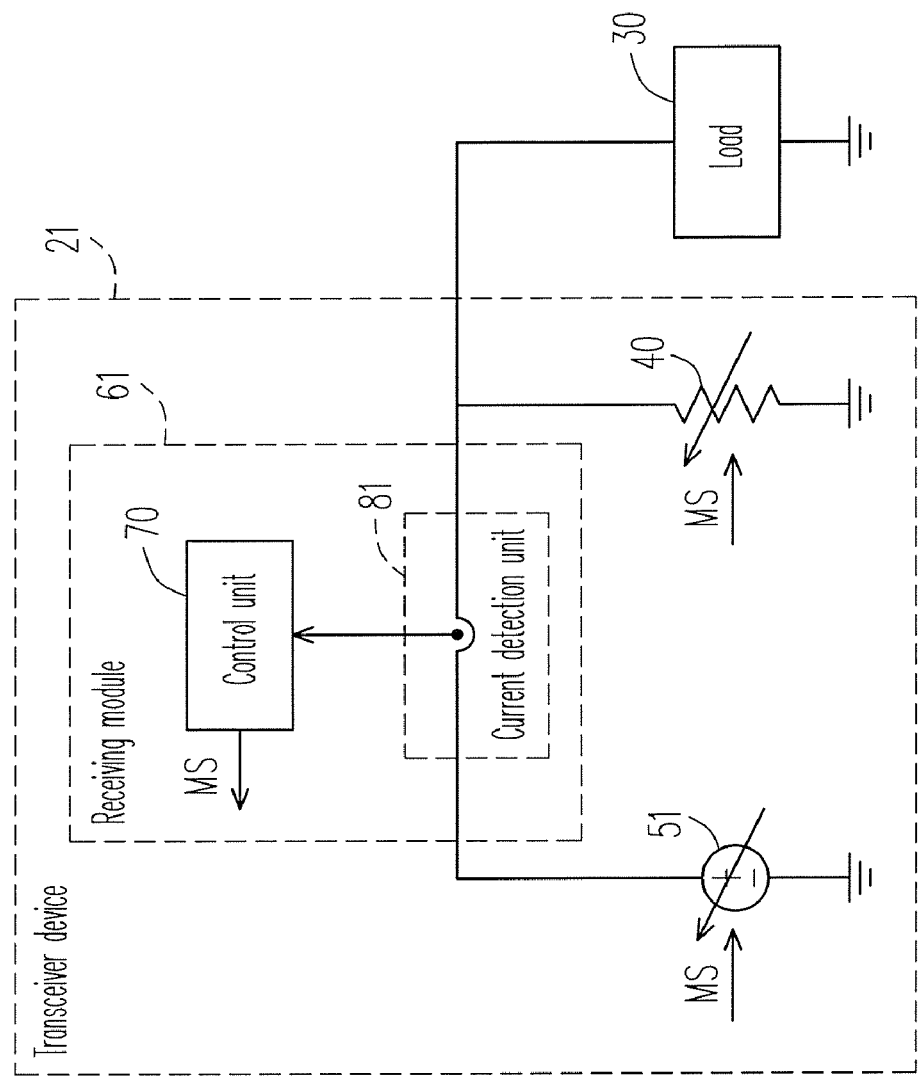
FIG. 4 is a schematic view of a transceiver device according to a second embodiment of the present invention.

FIG. 4 is a schematic view of a transceiver device according to a second embodiment of the present invention. Referring to FIGS. 2 and 4, this embodiment is similar to the first embodiment, in which the description of the elements with the same numerals may be obtained with reference to the above embodiment. It should be noted that the adjustable power unit 51 of this embodiment is an adjustable voltage unit. Referring to the following Table 3, in this embodiment, as the matching mode is altered, the adjustable power unit 51 may alter the default power accordingly, and it is not described here.

TABLE 3

Corresponding table of the matching mode, the candidate
impedance, and the candidate power of the second embodiment

| Matching Mode | Candidate Impedance (Ω) | Candidate Power (V) |
|---|---|---|
| First Mode | 80 Ω | 0.8 V |
| Second Mode | 90 Ω | 0.9 V |
| Third Mode | 100 Ω | 1 V |
| Fourth Mode | 110 Ω | 1.1 V |
| Fifth Mode | 120 Ω | 1.2 V |

Besides, in this embodiment, the ADC 80 is replaced by a current detection unit 81. The current detection unit 81 is coupled to the adjustable power unit 51, the adjustable impedance unit 40, and the control unit 70, for detecting a current value outputted from the adjustable power unit 51.

Accordingly, in this embodiment, after the transceiver device 21 selects one of the plurality of matching modes, the receiving module 61 may determine whether the impedance of the adjustable impedance unit 40 is matched with the impedance of the load 30 or not according to the current value outputted from the adjustable power unit 51. For example, the receiving module 61 may determine whether the impedance of the adjustable impedance unit 40 is matched with the impedance of the load 30 or not according to the following Table 4. When the impedance of the adjustable impedance unit 40 is not matched with the impedance of the load 30, the control unit 70 may alter the matching mode signal MS. In this manner, the effect similar to the above embodiment may also be achieved.

TABLE 4

Contrast table of the current value outputted from the adjustable power unit 51 corresponding to each matching mode of the second embodiment

| Matching Mode | Current value outputted from the adjustable power unit 51, when the impedance of the adjustable impedance unit 40 is matched with the impedance of the load 30 |
|---|---|
| First Mode | 0.02 A ± 10% |
| Second Mode | 0.02 A ± 10% |
| Third Mode | 0.02 A ± 10% |
| Fourth Mode | 0.02 A ± 10% |
| Fifth Mode | 0.02 A ± 10% |

It should be noted that, as seen from the Table 3, when the adjustable impedance unit 40 adjusts the impedance to be larger, the adjustable power unit 51 adjusts the voltage to be larger, and when the adjustable impedance unit 40 adjusts the impedance to be smaller, the adjustable power unit 51 adjusts the current to be smaller. Therefore, in this embodiment, the output current of the adjustable power unit 51 may be maintained within a fixed range. In this manner, after the load 30 receives the signal output by the transceiver device 21, it is relatively easy to process the signal.

To sum up, in the present invention, the impedance of the transceiver device may be altered to be matched with the impedance of the external load, thereby restraining the echo signal from being generated. In addition, the embodiments of the present invention at least have the following efficacies.

1. When the adjustable impedance unit adjusts the impedance, the adjustable power unit adjusts the current accordingly, such that the output voltage is maintained within the fixed range. In this manner, it is easy for the receiving end to process the signal.

2. When the adjustable impedance unit adjusts the impedance, the adjustable power unit adjusts the voltage accordingly, such that the output current is maintained within the fixed range. In this manner, it is easy for the receiving end to process the signal.

3. Even under the situation that the impedance of the external load is unknown, the adjustable impedance unit may still adjust the impedance, such that the impedance of the adjustable impedance unit is matched with the impedance of the load.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transceiver device, comprising:
   an adjustable impedance unit, for selecting a default impedance from a plurality of candidate impedances according to a matching mode signal;
   an adjustable power unit, coupled to the adjustable impedance unit, for selecting a default power from a plurality of candidate powers according to the matching mode signal, wherein the default power is corresponding to the default impedance, and the adjustable power unit outputs a transmission signal to a load together with the adjustable impedance unit; and
   a receiving module, coupled to the adjustable impedance unit, for receiving a response signal derived from the transmission signal, and determining whether the default impedance is matched with an impedance of the load or not by checking whether a parameter of the response signal falls within a default range or not.

2. The transceiver device according to claim 1, wherein the receiving module comprises:
   a control unit, coupled to the adjustable impedance unit and the adjustable power unit, for checking whether the parameter falls within the default range or not,
   wherein when the parameter falls within the default range, it represents that the default impedance is matched with the impedance of the load, and when the parameter does not fall within the default range, the control unit alters the matching mode signal correspondingly.

3. The transceiver device according to claim 2, wherein the receiving module further comprises:
   a current detection unit, coupled to the adjustable impedance unit, the adjustable power unit, and the control unit, for detecting a current value outputted from the adjustable power unit.

4. The transceiver device according to claim 2, wherein the receiving module further comprises:
   an analog-to-digital converter (ADC), coupled between the adjustable impedance unit and the control unit, for converting the response signal.

5. The transceiver device according to claim 1, further comprising:
   a triggering device, coupled to the adjustable impedance unit and the adjustable power unit, for generating the matching mode signal according to a trigger event.

6. The transceiver device according to claim 1, wherein the adjustable power unit is an adjustable voltage unit.

7. The transceiver device according to claim 1, wherein the adjustable power unit is an adjustable current unit.

8. The transceiver device according to claim 1, wherein the parameter is a voltage or a current.

9. An impedance matching method, comprising:
   setting a plurality of matching modes, wherein each matching mode comprises a default impedance and a corresponding default power;
   selecting one of the matching modes, thereby outputting a transmission signal to a load;
   receiving a response signal derived from the transmission signal; and
   determining whether the default impedance is matched with an impedance of the load or not by checking whether a parameter falls within a default range, thereby determining whether the default impedance is matched with the impedance of the load or not.

10. The impedance matching method according to claim 9, wherein the parameter is a voltage or a current.

* * * * *